(12) United States Patent
Chang et al.

(10) Patent No.: US 9,257,835 B2
(45) Date of Patent: Feb. 9, 2016

(54) OUTPUT-STAGE CIRCUIT AND METHOD FOR OVER CURRENT PROTECTION THEREOF AND AUDIO AMPLIFY SYSTEM

(71) Applicant: ANPEC ELECTRONICS CORPORATION, Hsinchu (TW)

(72) Inventors: Ming-Hung Chang, Hsinchu County (TW); Chia-Pauo Wu, New Taipei (TW)

(73) Assignee: Anpec Electronics Corporation, Hsinchu (TW)

( * ) Notice: Subject to any disclaimer, the term of this patent is extended or adjusted under 35 U.S.C. 154(b) by 281 days.

(21) Appl. No.: 13/952,800

(22) Filed: Jul. 29, 2013

(65) Prior Publication Data

US 2014/0294205 A1 Oct. 2, 2014

(30) Foreign Application Priority Data

Mar. 29, 2013 (TW) .............................. 102111441 A

(51) Int. Cl.
*H03F 3/217* (2006.01)
*H03F 1/52* (2006.01)
*H02H 9/04* (2006.01)
*H04R 3/00* (2006.01)

(52) U.S. Cl.
CPC . *H02H 9/04* (2013.01); *H03F 1/52* (2013.01); *H03F 3/217* (2013.01); *H04R 3/007* (2013.01); *H04R 2400/00* (2013.01)

(58) Field of Classification Search
CPC .................................. H03F 3/217; H03F 1/52
USPC ..................... 330/10, 207 A, 207 P, 251, 298
See application file for complete search history.

(56) References Cited

U.S. PATENT DOCUMENTS

| | | | |
|---|---|---|---|
| 7,265,614 B2 * | 9/2007 | Chang et al. .................... 330/51 |
| 7,554,399 B1 * | 6/2009 | Gaboriau et al. ............. 330/251 |
| 7,554,409 B1 * | 6/2009 | Zhang et al. .................. 330/298 |
| 7,649,414 B2 * | 1/2010 | Kaya et al. .................... 330/251 |

* cited by examiner

*Primary Examiner* — Steven J Mottola
*Assistant Examiner* — Hafizur Rahman
(74) *Attorney, Agent, or Firm* — Rosenberg, Klein & Lee

(57) ABSTRACT

An output-stage circuit is disclosed. The output-stage circuit includes high-side output driver, first body selector, low-side output driver, second body selector and inductance. When output current is larger than current threshold value so as to make the low-side output driver generate overcurrent, the low-side output driver controlled by second control signal is disabled, and the high-side output driver controlled by first control signal is enabled so as to create first current channel. When output current is larger than current threshold value so as to make the high-side output driver generate overcurrent, the high-side output driver controlled by the first control signal is disabled, and the low-side output driver controlled by the second control signal is enabled so as to create second current channel to avoid current flowing through low-side output driver's body, and thus reduce the output current and voltage spiking of the output voltage.

13 Claims, 7 Drawing Sheets

OUTPUT-STAGE CIRCUIT AND METHOD FOR OVER CURRENT PROTECTION THEREOF AND AUDIO AMPLIFY SYSTEM

BACKGROUND OF THE DISCLOSURE

1. Field of the Disclosure

The instant disclosure relates to an output-stage circuit: in particular, to an over-current protection method of the output-stage circuit.

2. Description of Related Art

In recent years, considering technology of semiconductor is getting more mature and portable consumer electronics devices are getting wide popularity, how to design an audio amplifier has become an important research topic. Generally speaking, an output-stage circuit is consisted of a high-side output driver and a low-side output driver, and the high-side output driver devices and low-side output driver device are respectively connected to the body selector to prevent a speaker from making a clicking sound, wherein the high-side output driver is a high-side P-type power transistor, and the low-side output driver is a low-side N-type power transistor. Regarding cause and control of the clicking sound, there is reference in content of disclosure in U.S. Pat. No. 7,265,614.

Generally speaking, an audio amplifier utilizes a load, such as a speaker, through an output-stage circuit. Once the current flowing through is larger than an affordable value of the high-side P-type power transistor or the low-side N-type power transistor, there will be an over-current fault, wherein there are a lot causes of the over-current fault, such as a short circuit or a spiking voltage. The faults may hurt the high-side P-type power transistor or the low-side N-type power transistor seriously and permanently, and further lead to a damage to the entire audio circuit. For example, in prior art, when an output current flowing into a body selector through the high-side P-type power transistor to release the output current, the spiking voltage of the output voltage will be too high because of a body diode inside of the high-side P-type power transistor and the body selector; on the other hand, when the output current flowing into another body selector through the low-side N-type transistor to release an output current, the spiking voltage of the output voltage will be too low because of a body diode inside of the N-type transistor and the body selector.

Therefore, how to avoid sudden arising current from damaging circuit elements becomes a problem for an audio circuit design.

SUMMARY OF THE DISCLOSURE

The instant disclosure provides an output-stage circuit, and the output-stage circuit includes a high-side output driver, a first body selector, a low-side output driver, a second body selector, and an inductor. The high-side output driver is electrically connected to a system voltage and a first control signal. The first body selector is electrically connected to the high-side output driver, and the first body selector receives a first reference voltage and the system voltage. The low-side output driver is electrically connected to a ground voltage and a second control signal, wherein the high-side output driver is directly connected to the low-side output driver and generates an output voltage. The second body selector is electrically connected to the low-side output driver, and the second body selector receives a second reference voltage and the ground voltage. An end of the inductor is electrically connected to the output voltage, and another end of the inductor is electrically connected to a third reference voltage, and there is an output current flowing through the inductor. When the output current is larger than a current threshold value so that the low-side output driver generates an overcurrent, the low-side output driver controlled by the second control signal is disabled, and the high-side output driver controlled by the first control signal is enabled so as to establish an output end of low impedance to a first current channel of the system voltage, and to prevent the current flowing through a body of the high-side output driver, and accordingly to reduce the spiking voltage of the output voltage after an overcurrent prevention started by the low-side output driver; when the output current is larger than the current threshold value so that the high-side output driver generates an overcurrent, the high-side output driver controlled by the first control signal is disabled, and the low-side output driver controlled by the second control signal is enabled so as to establish an output end of low impedance to a second current channel of the system voltage, and a current path of the output current is changed so as to prevent the current flowing through a body of the high-side output driver, and accordingly to reduce the output current and a voltage spiking of the output voltage after an overcurrent prevention started by the high-side output driver.

In an embodiment of the instant disclosure, when an output current reduces until becoming a zero current, a high-side output driver controlled by a first control signal is disabled to close a first current channel, wherein the first current channel has a better feature of low impedance in comparison to a first body selector.

In an embodiment of the instant disclosure, when an output current reduces until becoming a zero current, a low-side output driver controlled by a second control signal is disabled to close a second current channel, wherein the second current channel has a better feature of low impedance in comparison to a second body selector.

In an embodiment of the instant disclosure, an output-stage circuit further includes a detector and a controller. The detector is for detecting if an output current is larger than a current threshold value or a zero current, and accordingly to transmit a detecting result. The controller is electrically connected to the detector, and according to the detecting result received to transmit a first control signal and a second control signal respectively to a high-side output driver and a low-side output driver corresponded so as to control a state of being disabled or being enabled.

In an embodiment of the instant disclosure, a third reference voltage is a system voltage or a ground voltage.

In an embodiment of the instant disclosure, a high-side output driver includes a first P-type transistor, and a low-side output driver includes a first N-type transistor, wherein the first P-type transistor has a gate receiving a first control signal and accordingly determining to be open or closed, a source connected to a system voltage, a drain connected to output node, a body connected to a first body selector, and a embedded drain(P+) to body(N-Well) diode called as first body diode; wherein the first N-type transistor has a a gate receiving a second control signal and accordingly to determine whether to be open or closed, a source connected to a ground voltage, a drain connected to the same output node of the first P-type transistor, a body connected to a second body selector, and a embedded body(P-sub or P-well) to drain(N+) diode called as second body diode; wherein when a current value of an output current is larger than a current threshold value so that there is an overcurrent at the first N-type transistor, and the first N-type transistor controlled by a second control signal is disabled, and the first P-type transistor controlled by the first control signal is enabled so as to create a first current channel so as to reduce the current value of the output current and a spiking voltage of the output voltage, wherein the first current channel is a channel between a drain and a source of the first P-type transistor.

In an embodiment of the instant disclosure, when a current value of an output current is larger than a current threshold value so that there is an overcurrent at the first P-type transistor, a first P-type transistor controlled by a first control signal is disabled, and a first N-type transistor controlled by a second control signal is enabled to create a second current channel so as to reduce the current value of the output current and a spiking voltage of the output voltage, wherein the second current channel is a channel between a drain and a source of the first N-type transistor.

In an embodiment of the instant disclosure, a high-side output driver further includes a second P-type transistor, and a low-side output driver further includes a second N-type transistor, wherein the second P-type transistor has a third body diode having a source connected to a drain of the first P-type transistor, and having a gate receiving a third control signal so as to determine to be open or closed, and the second N-type transistor has a fourth body diode having a drain connected to a drain of the second P-type transistor and outputs an output voltage, and having a gate receiving a fourth control signal so as to determine to be open or closed, and having a source connected to a drain of the first N-type transistor.

The present embodiment further provides an over-current protection method, the output-stage circuit includes a high-side output driver, a first body selector, a low-side output driver, a second body selector, and an inductor, wherein the high-side output driver is electrically connected to a system voltage and a first control signal, and the first body selector is electrically connected to a high-side output driver, and receives a first reference voltage and a system voltage, the low-side output driver is electrically connected to a ground voltage and a second control signal, and a high-side output driver is directly connected to the low-side output driver to generate an output voltage, and the second body selector is electrically connected to the low-side output driver and receives a second reference voltage and a ground voltage; an end of an inductor is electrically connected to the output voltage, and another end is electrically connected to a third reference voltage, and there is an output current flowing through the inductor. An over-current protection method includes steps as follows: detecting a current value of an output current; determining whether there is an overcurrent at a high-side output driver or a low-side output driver; when the current value of an output current is larger than a current threshold value so that there is an overcurrent at the low-side output driver, the low-side output driver is disabled and the high-side output driver is enabled to create a current channel so as to reduce the current value of the output current and a spiking voltage of the output voltage, and when the output current reduces until becoming a zero current, the high-side output driver is disabled; when the current value of the output current is larger than the current threshold value so that there is an overcurrent at the high-side output driver, the high-side output driver is disabled and the low-side output driver is enabled to create a second current channel so as to reduce the current value of the output current and a spiking voltage of the output voltage, and when the output current reduces until becoming a zero current, the low-side output driver is disabled.

An embodiment of the instant disclosure further provides an audio amplify system, the audio amplify system includes a pre-stage amplifier, an output-stage circuit and a load. The pre-stage amplifier receives and amplifies an input signal. The output-stage circuit is electrically connected to the pre-stage amplifier. The load is electrically connected to the output-stage circuit.

To sum up, the instant disclosure provides an output-stage circuit and an over-current protection method and an audio amplify system, which are able to utilize detecting if an output current is larger than a current threshold value to determine whether to change a current path of the output current, which means to bring the output current to a first current channel or a second current channel to reduce a current value of the output current, and further to reduce a spiking voltage of the output voltage to prevent the output voltage from damaging or striking the relevant electronic elements.

For further understanding of the instant disclosure, reference is made to the following detailed description illustrating the embodiments and examples of the instant disclosure. The description is only for illustrating the instant disclosure, not for limiting the scope of the claim.

DETAILED DESCRIPTION OF PREFERRED EMBODIMENTS

Figure 1:
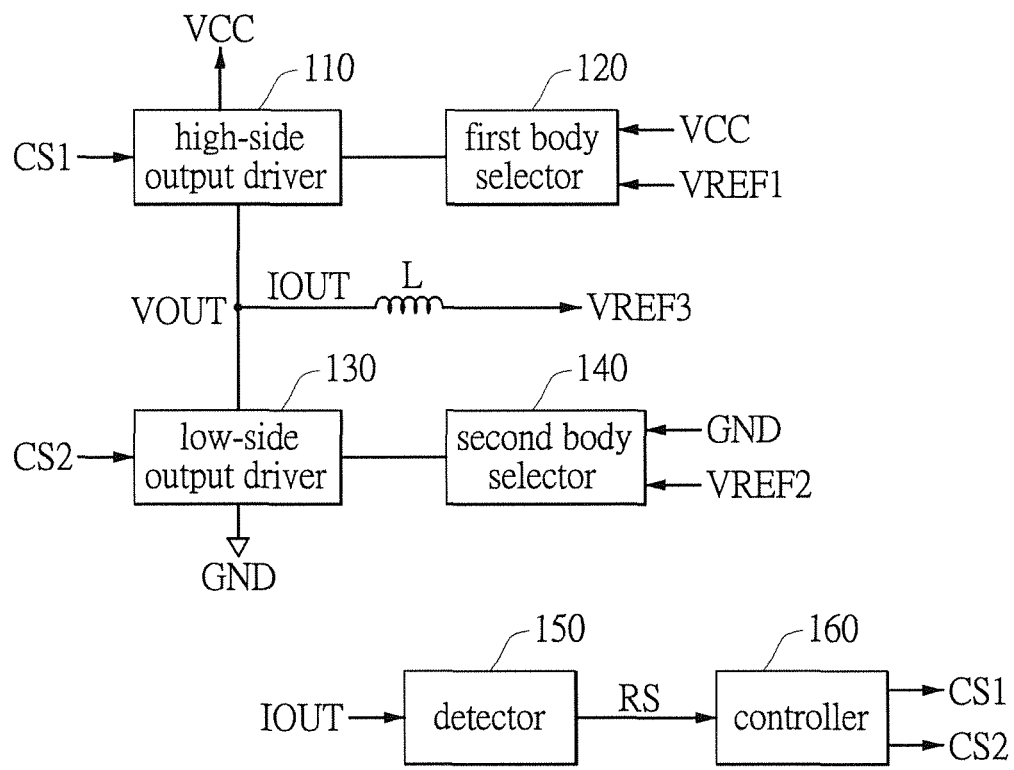
FIG. 1 shows a schematic diagram of a circuit block of an output-stage circuit according to an embodiment of the instant disclosure.

The aforementioned illustrations and following detailed descriptions are exemplary for the purpose of further explaining the scope of the instant disclosure. Other objectives and advantages related to the instant disclosure will be illustrated in the subsequent descriptions and appended drawings. In the drawings, the size and relative sizes of layers and regions may be exaggerated for clarity.

It will be understood that, although the terms first, second, third, and the like, may be used herein to describe various elements, components, regions, layers and/or sections, these elements, components, regions, layers and/or sections should not be limited by these terms. These terms are only to distinguish one element, component, region, layer or section from another region, layer or section discussed below could be termed a second element, component, region, layer or section without departing from the teachings of the instant disclosure. As used herein, the term "and/or" includes any and all combinations of one or more of the associated listed items.

[Embodiment of an Output-Stage Circuit]

Referring to FIG. 1, FIG. 1 shows a schematic diagram of a circuit block of an output-stage circuit according to an embodiment of the instant disclosure. As shown in FIG. 1, the output-stage circuit 100 includes a high-side output driver 110, a first body selector 120, a low-side output driver 130, a second body selector 140, and an inductor L. The high-side output driver 110 is electrically connected to a system voltage VCC and a first control signal CS1. The first body selector 120 is electrically connected to the high-side output driver 110. The low-side output driver 130 is electrically connected to a ground voltage GND and a second control signal CS2 and directly connected to the high-side output driver 110. The second body selector 140 is electrically connected to the low-side output driver 130. An end of the inductor L is electrically connected between the high-side output driver 110 and the low-side output driver 130 and there is an output voltage VOUT generated. Another end of the inductor L is electrically connected to a third reference voltage VREF3, and there is an output current IOUT flowing through the inductor L.

In the present embodiment, the output-stage circuit 100 further includes a detector 150 and a controller 160. The controller 160 is electrically connected to the detector 150. First of all, the instant disclosure utilizes the detector 150 to detect if the output current IOUT of the inductor L is larger than a current threshold value or if the output current IOUT a zero current, and accordingly transmits a detecting result RS to the controller 160. Afterward, the controller 160 respectively transmits the first control signal CS1 and the second control signal CS2 to the high-side output driver 110 and the low-side output driver 130 according to the detecting result RS received, so as to control a status to be disabled or enabled.

In the prior art, when the output current IOUT flowing into the first body selector 120 to release the output current IOUT through the high-side output driver 110, a spiking voltage of the output voltage VOUT will be too high; on the other hand, when the output current IOUT flowing into the second body selector 140 to release the output current IOUT through the low-side output driver 130, the spiking voltage of the output voltage VOUT will be too low. Therefore, the instant disclosure provides a change of releasing path of the output current IOUT to prevent the spiking voltage of the output voltage VOUT from being too high and further damaging electronic elements surrounding a terminal of the output voltage VOUT or leading to an circuit error operation, wherein the current releasing path has a feature of less impedance in comparison to the first body selector 120 or the second body selector 140.

There is more instruction for further teaching in a work mechanism of the output-stage circuit 100.

In the present embodiment, when the third reference voltage VREF3 is the system voltage, and when the detector 150 detects that the output current IOUT is larger than the current threshold value (which means that there is about to be an overcurrent at the low-side output driver 130), a detecting result RS will be transmitted to the controller 160. Afterwards, according to the detecting result RS received, the controller 160 will transmit the first control signal CS1 to the high-side output driver 110 to enable the high-side output driver 110 to create a first current channel; in the meantime, the second control signal CS2 will be transmitted to the low-side output driver 130 to disable the low-side output driver 130 so as to further change a current path of the output current IOUT, and accordingly to bring the output current IOUT to a first current channel inside the high-side output driver 110 to release the output current IOUT to another end of the system voltage VCC. The current channel has the feature of low impedance compared to the first body selector 120, and thus during a transient-state of releasing the output current IOUT, the spiking voltage of the output voltage VOUT will not surge too high, so that the electronic elements electrically connected to the output voltage VOUT are further protected. It is to be noticed that, in the present embodiment, during the transient-state of releasing the output current IOUT, the detector 150 will continuously detect a value change of the output current IOUT, when the detector 150 detects that the value of the output current IOUT reduces until becoming a zero current, the detector 150 will transmit the detecting result RS to the controller 160. Afterwards, according to the detecting result RS, the controller 160 will transmit the first control signal CS1 to the high-side output driver 110 to disable the high-side output driver 110 so as to prevent an overcurrent at the high-side output driver 110. Then the output voltage VOUT and the system voltage VCC will be at the same voltage level.

On the other hand, when the third reference voltage VREF 3 is the ground voltage, and when the detector 150 detects that the output current IOUT is larger than the current threshold value (which means that there is about to be an overcurrent at the high-side output driver 110), then there is the detecting result RS transmitted to the controller 160. Afterwards, according to the detecting result RS received, the controller 160 will transmit the first control signal CS1 to the high-side output driver 110 to disable the high-side output driver 110; in the meantime, the second control signal CS2 is transmitted to the low-side output driver 130 to enable the low-side output driver 130 so as to create a second current channel, and the current path of the output current IOUT is further changed, and accordingly the output current IOUT is brought to the second current channel inside the low-side output driver 130 to release the output current IOUT to the ground voltage GND. The second current channel has a feature of low impedance in comparison to the second body selector 140, and thus during the transient-state of releasing the output current IOUT, the spiking voltage of the output voltage VOUT will not surge too low, so that the electronic elements electrically connected to the output voltage VOUT are further protected. It is to be noticed that, in the present embodiment, during the transient-state of releasing the output current IOUT, the detector 150 will continuously detect the value change of the output current IOUT, and when the detector 150 detects that the value of the output current IOUT reduces until becoming a zero current, the detector 150 will transmit the detecting result RS to the controller 160. Afterwards, according to the detecting result RS, the controller 160 will transmit the second control signal CS2 to the low-side output driver 130 to disable the low-side output driver 130 so as to prevent an overcurrent at the low-side output driver 130. Then the output voltage VOUT and the ground voltage GND will be at the same voltage level.

There will be at least one embodiment for a further instruction in describing a specific operation process of the output-stage circuit 100 of the instant disclosure.

In the following embodiments, there are only parts different from the embodiment in FIG. 1 described, and the omitted parts are indicated to be identical to the parts of the embodiment in FIG. 1. In addition, for an easy instruction, similar numbers or symbols are referred to similar elements.

[Embodiment of an Output-Stage Circuit]

Figure 2:
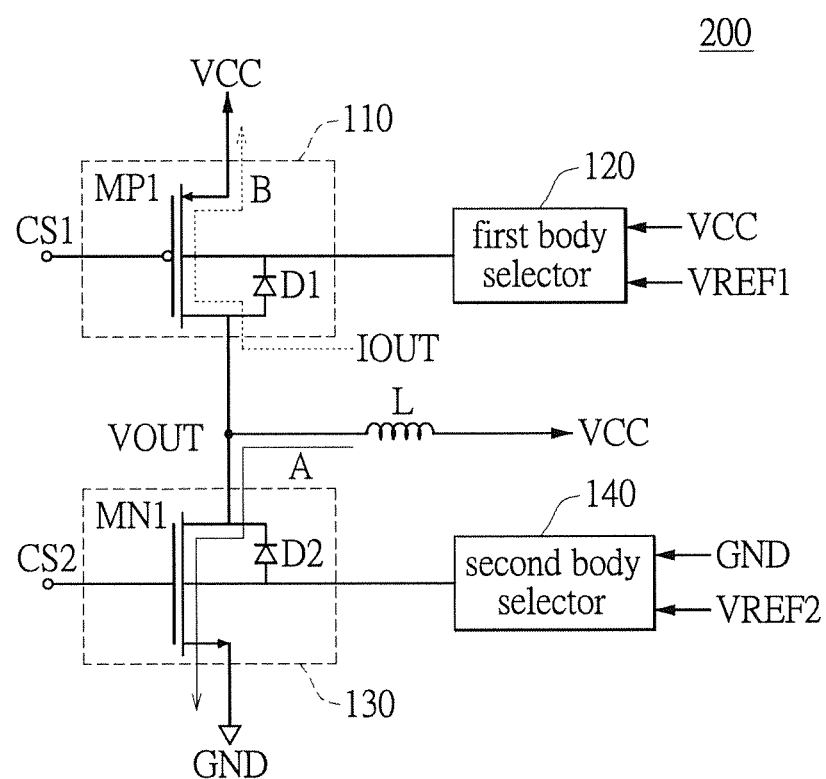
FIG. 2 shows a schematic diagram of a detailed circuit of an output-stage circuit according to an embodiment of the instant disclosure.

Referring to FIG. 2, FIG. 2 shows a schematic diagram of a detailed circuit of an output-stage circuit according to an embodiment of the instant disclosure. As shown in FIG. 2, different from FIG. 1, in the present embodiment, a high-side output driver 110 includes a first P-type transistor MP1, and a low-side output driver 130 includes a first N-type transistor MN1. The first P-type transistor MP1 has a first body diode D1, a gate of the first P-type transistor MP1 receives a first control signal CS1 and accordingly to determine whether to be open or closed, and a source of the first P-type transistor MP1 is connected to a system voltage VCC, and a drain of the first P-type transistor MP1 outputs the output voltage VOUT, and a body of the first P-type transistor MP1 is connected to a first body selector 120. The first N-type transistor MN1 has a body diode D2, and a gate of the first N-type transistor MN1 receives a second control signal CS2 and accordingly to determine whether to be open or closed, and a source of the first N-type transistor MN1 is connected to a ground voltage GND, and a drain of the first N-type transistor MN1 is connected to the drain of the first P-type transistor MP1, and a body of the first N-type transistor MN1 is connected to a second body selector 140.

There is further instruction in teaching a work mechanism of the output-stage circuit 200 so as to understand the instant disclosure better.

Figure 3:
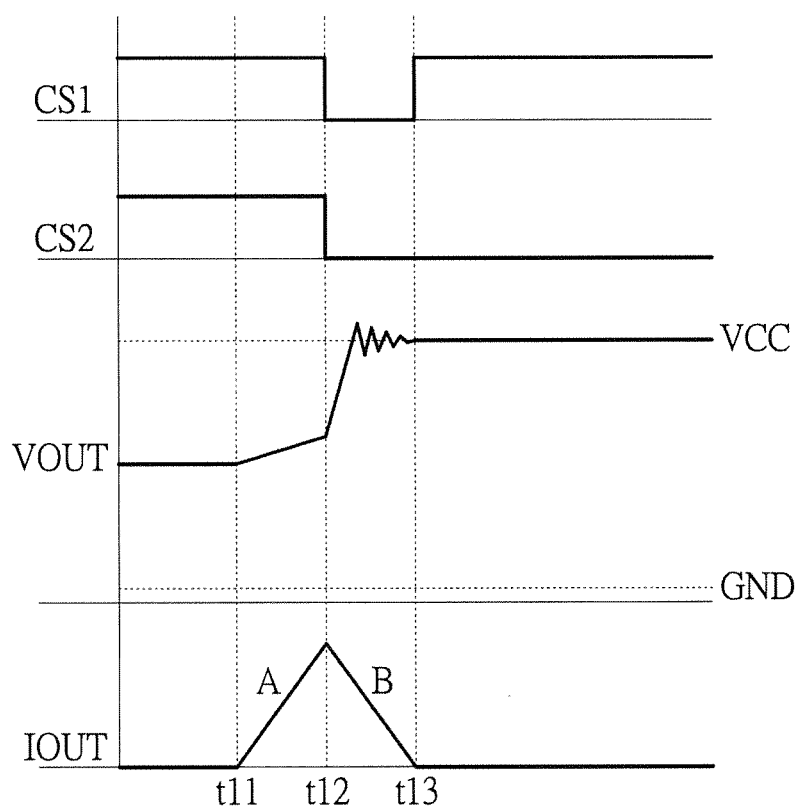
FIG. 3 shows a waveform diagram according to the output-stage circuit driven in FIG. 2.

Referring FIGS. 1-3 together, FIG. 3 shows a waveform diagram according to the output-stage circuit driven in FIG. 2. Regarding the output-stage circuit 200 of the present embodiment, when an end of an inductor L electrically connected to a third reference voltage VREF3 is the system voltage VCC; likewise, during a time from t11 to t12, the output voltage VOUT continuously gets larger towards a voltage level of the system voltage VCC and an output current IOUT also continuously increases, wherein a current path of the output current IOUT is shown as a symbol of A. At t12, the detector 150 detects that the output current IOUT flowing through the inductor L is larger than a current threshold value (which means that the first N-type transistor MN1 may be an overcurrent), then there is a detecting result RS transmitted to the controller 160, wherein a designer may further design a current threshold value according to an actual circuit application demand. Afterwards, according to the detecting result RS received, the controller 160 transits the first control signal CS1 of a high voltage level to a low voltage level and transmits the first control signal CS1 to the first P-type transistor MP1 to open the first P-type transistor MP1 and to create a first current channel, wherein the first current channel having a feature of low impedance is a p-channel between a drain and a source of the first P-type transistor MP1; meanwhile, the second control signal CS2 at a high voltage level is also transited to a low voltage level and the second control signal CS2 is transmitted to the first N-type transistor MN1 to close the first N-type transistor MN1 and to further change the current path of the output current IOUT, and accordingly the output current IOUT is brought to the first current channel inside the first P-type transistor MP1 to release the output current IOUT to an end of the system voltage VCC, wherein a current path of the output current IOUT is shown as symbol B, and the current volume starts to present a sign of decreasing. The current path that the output current IOUT flows through the first current channel has a more obvious feature of lower impedance than the current path that the output current IOUT flows through a first body diode D1 and the first body selector 120; therefore, during the time from t12 to t13, which means during a transient-state of releasing the output current IOUT, a spiking voltage of an output voltage VOUT will not overly surge high, so that the most surge of the output voltage VOUT is not much more than the system voltage VCC, and further to protect the relevant electronic elements electrically connected to the output voltage VOUT. It is to be noticed that, in the present embodiment, during the transient-state of releasing the output current IOUT (i.e. from t12 to t13), the detector 150 still keeps detecting a value change of the output current IOUT; at t13, the detector 150 detects that the current value of the output current IOUT decreases until becoming zero current, and the detector 150 transmits the detecting result RS to the controller 160. Afterwards, according to the detecting result RS, the controller 160 transits the first control signal CS1 of the low voltage level to the high voltage level and transmits the first control signal CS1 to the first P-type transistor MP1 to close the first P-type transistor MP1 to prevent the first P-type transistor MP1 from becoming an overcurrent. Then, the output voltage VOUT and the system voltage VCC are at the same voltage level.

Figure 4:
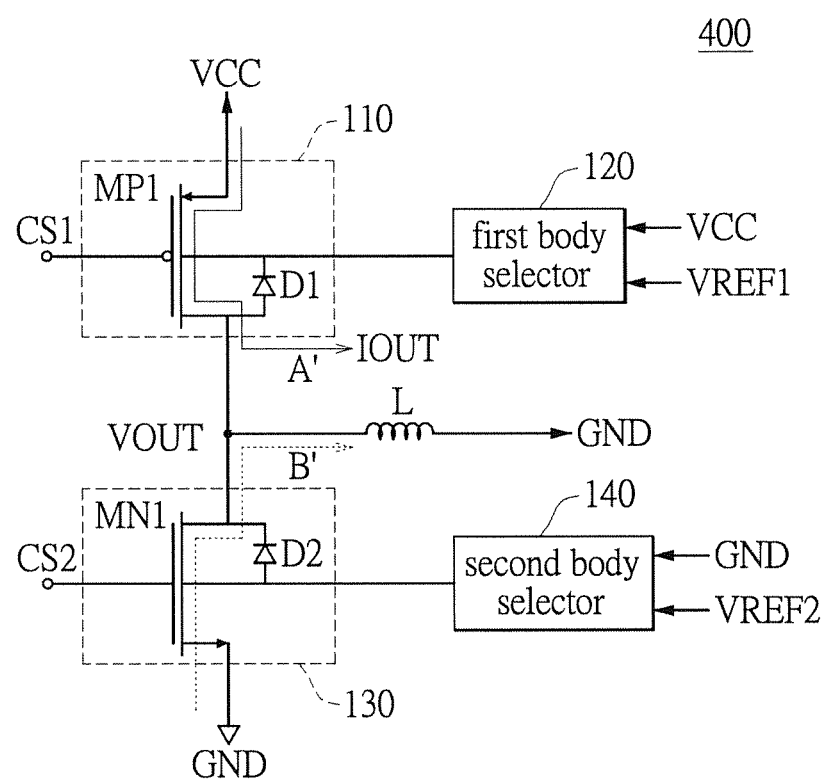
FIG. 4 shows a detailed diagram of an output-stage circuit according to the instant disclosure.
Figure 5:
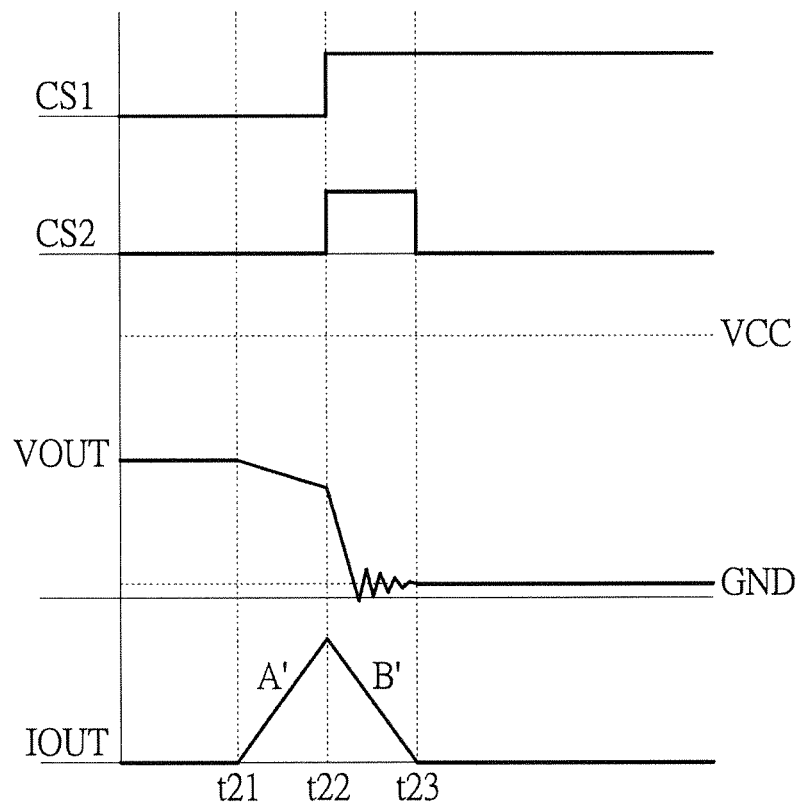
FIG. 5 shows a waveform diagram according to the output-stage circuit driven and drawn in FIG. 4.

On the other hand, referring to FIGS. 1, 4, and 5, FIG. 4 shows a detailed diagram of an output-stage circuit according to the instant disclosure. FIG. 5 shows a waveform diagram according to the output-stage circuit driven and drawn in FIG. 4. Before further instruction, it is to be clarified that in comparison to the output-stage circuit 200 in FIG. 2, the difference will be a current path of the output-stage circuit 400 from FIG. 4, like the current path A corresponds to a current path A', and the current path B corresponds to a current path B'.

In the present embodiment, another end of the inductor L of the output-stage circuit 400 electrically connected to the third reference voltage VREF3 is the ground voltage GND; during a time from t21 to t22, the output voltage VOUT continuously gets smaller towards a voltage level of the ground voltage GND and the output current IOUT also continuously increases, wherein a current path of the output current IOUT is shown as a symbol of A'. At the time of t22, the detector 150 detects that the output current IOUT flowing through the inductor L is larger than a current threshold value (which means that the first P-type transistor MP1 may about to be an overcurrent), then there is a detecting result RS transmitted to the controller 160, wherein a designer may further design a current threshold value according to an actual circuit application demand. Afterwards, according to the detecting result RS received, the controller 160 transits the first control signal CS2 of a low voltage level to a high voltage level and transmits the first control signal CS2 to the first N-type transistor MN1 to open the first N-type transistor MN1 and to create a second current channel, wherein the second current channel having a feature of low impedance is a n-channel between a drain and a source of the first N-type transistor MN1; meanwhile, the first control signal CS1 of low voltage level is transited to a high voltage level and the first control signal CS1 is transmitted to the first P-type transistor MP1 to close the first P-type transistor MP1 and to further change the current path of the output current IOUT, and accordingly the output current IOUT is brought to the second current channel inside the first N-type transistor MN1 to release the output current IOUT to an end of the ground voltage GND, wherein a current path of the output current IOUT is shown as symbol B', and the current volume starts to present a sign of decreasing. The current path that the output current IOUT flows through the second current channel has a more obvious feature of lower impedance than the current path that the output current IOUT flows through a second body diode D2 and a second body selector 140; therefore, during the time from t22 to t23, which means during a transient-state of releasing the output current IOUT, a spiking voltage of an output voltage VOUT will not overly surge low, so that the most surge of the output voltage VOUT is not much more than the ground voltage GND, and further to protect the relevant electronic elements electrically connected to the output voltage VOUT. It is to be noticed that, in the present embodiment, during the transient-state of releasing the output current IOUT (i.e. from t22 to t23), the detector 150 still keeps detecting a value change of the output current IOUT; at t23, the detector 150 detects that the current value of the output current IOUT decreases until becoming zero current, and the detector 150 transmits the detecting result RS to the controller 160. Afterwards, according to the detecting result RS, the controller 160 transits the first control signal CS2 of the high voltage level to the low voltage level and transmits the second control signal CS2 to the first N-type transistor MN1 to close the first N-type transistor MN1 to prevent the first N-type transistor MN1 from becoming an overcurrent. Then, after getting into the steady-state period, the output voltage VOUT will be stabilized at the same voltage level as the ground voltage GND.

In the following embodiments, there are only parts which are different from the embodiment in FIG. 4 described, and which means the omitted parts are identical to the parts of the embodiment in FIG. 4. Besides, for an easy instruction, similar referred numbers or symbols are indicated to be similar elements.

[An Embodiment of an Output-Stage Circuit]

Figure 6:
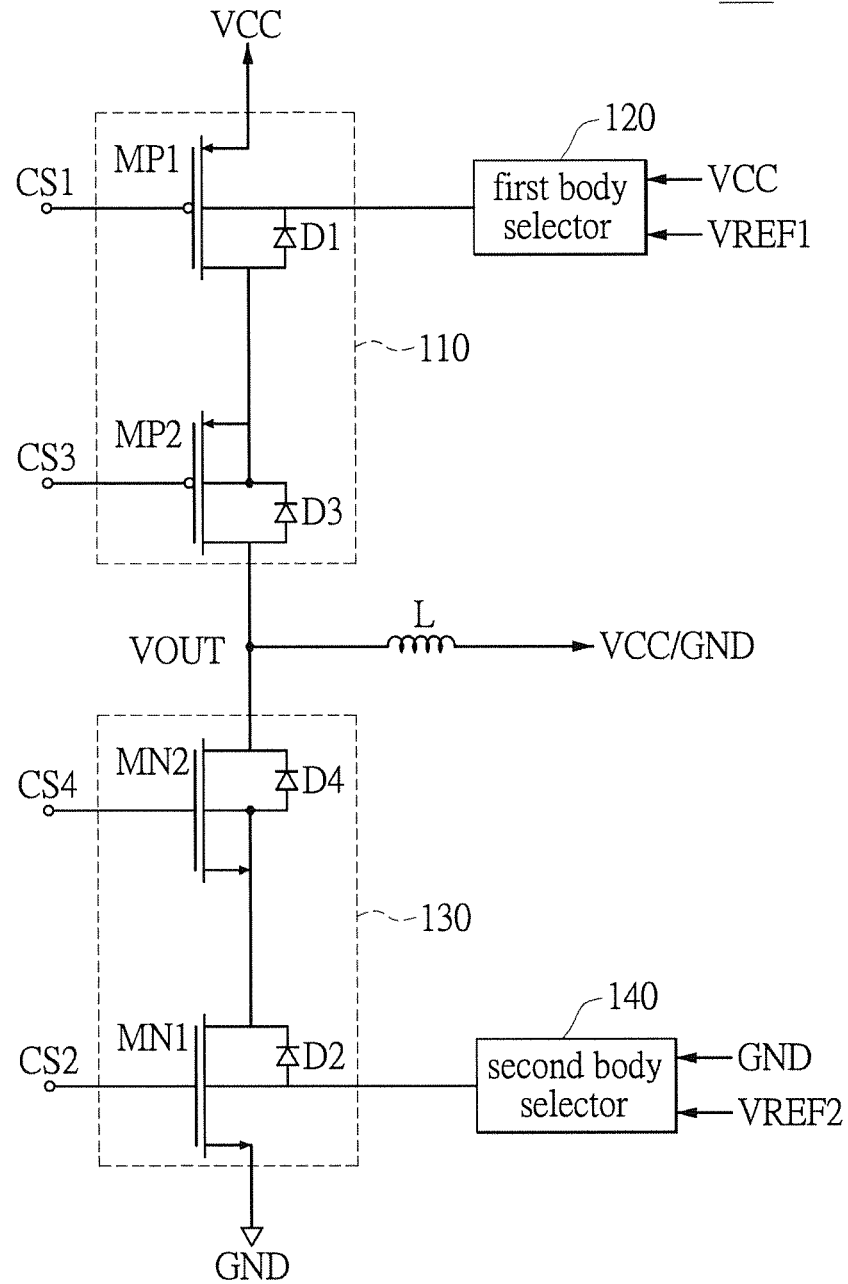
FIG. 6 shows a detailed diagram of an output-stage circuit according to an embodiment of the instant disclosure.

Referring to FIG. 6, FIG. 6 shows a detailed diagram of an output-stage circuit according to an embodiment of the instant disclosure. Different from the embodiment in FIG. 4, a high-side output driver 110 further includes a second P-type transistor MP2, and a low-side output driver 130 further includes a second N-type transistor MN2. The second P-type transistor MP2 has a third body diode D3, and a source of the second P-type transistor MP2 is connected to a drain of the first P-type transistor MP1, and a gate of the second P-type transistor receives a third control signal CS3 and accordingly to determine to be open or closed, and the second N-type transistor MN2 has a fourth body diode D4, and a drain of the second N-type transistor MN2 is connected to a drain of the second P-type transistor MP2 and outputs an output voltage VOUT, and a gate of the second N-type transistor MN2 receives a fourth control signal CS4 and accordingly determine to be open or closed, and a source of the second N-type transistor MN2 is connected to a drain of the first N-type transistor MN1. Briefly, the embodiment constructs an output-stage circuit 600 by cascade; therefore, any idea which is not irrelevant to cascade is identified to be within the scope of the present embodiment of the instant disclosure.

If it is needed, please refer to the waveform of driving in FIG. 3 to further understand the present embodiment, wherein a waveform of the third control signal CS3 is identical to the waveform of the first control signal CS1, and the waveform of the fourth control signal CS4 is identical to the waveform of the second control signal CS2. In the output-stage circuit 600 of the present embodiment, when an end of an inductor L electrically connected to a third reference voltage VREF3 is the system voltage VCC; likewise, the output voltage VOUT continuously gets larger towards a voltage level of the system voltage VCC and an output current IOUT also continuously increases. When a detector 150 detects that the output current IOUT flowing through the inductor L is larger than a current threshold value (which means that the first N-type transistor MN1 or the second N-type transistor MN2 may be overcurrent), then there is a detecting result RS transmitted to the controller 160, wherein a designer may further design a current threshold value according to an actual circuit application demand. Afterwards, according to the detecting result RS received, the controller 160 transits the first control signal CS1 and the third control signal CS3 of a high voltage level to a low voltage level and transmits the first control signal CS1 and the third control signal CS3 to the first P-type transistor WP1 and the second P-type transistor MP2 correspondingly to open the first P-type transistor MP1 and the second P-type transistor MP2 to create a first current channel and a third current channel, wherein the first current channel and the third current channel both having a feature of low impedance are respectively a p-channel between a drain and a source of the first P-type transistor MP1 and a p-channel between a drain and a source of the second P-type transistor MP2; meanwhile, the controller 160 also transits the second control signal CS2 and the fourth control signal CS4 from the high voltage level to the low voltage level and transmits the second control signal CS2 and the fourth control signal CS4 to the first N-type transistor MN1 and the second N-type transistor MN2 to close the first N-type transistor MN1 and the second N-type transistor MN2 to further change the current path of the output current IOUT, and accordingly the output current IOUT is brought to the first current channel and the third current channel inside the first P-type transistor MP1 and the second P-type transistor MP2 to release the output current IOUT to an end of the system voltage VCC, wherein a current path of the output current IOUT is shown as symbol B, and the current volume starts to present a sign of decreasing. The current path that the output current IOUT flows through the first current channel and the third channel has a more obvious feature of lower impedance than the current path that the output current IOUT flows through a first body diode D1 and a third body diode D3 and the first body selector 120; therefore, during the time from t12 to t13, which means during a transient-state of releasing the output current IOUT, a spiking voltage of an output voltage VOUT will not overly surge high, so that the most surge of the output voltage VOUT is not much more than the system voltage VCC, and further to protect the relevant electronic elements electrically connected to the output voltage VOUT. It is to be noticed that, in the present embodiment, during the transient-state of releasing the output current IOUT, the detector 150 still keeps detecting a value change of the output current IOUT; at t13, the detector 150 detects that the current value of the output current IOUT decreases until becoming zero current, and the detector 150 transmits the detecting result RS to the controller 160. Afterwards, according to the detecting result RS, the controller 160 transits the first control signal CS1 and the third control signal CS3 of the low voltage level to the high voltage level and transmits the first control signal CS1 and the third control signal CS3 to the first P-type transistor MP1 and the second P-type transistor MP2 to close the first P-type transistor MP1 and the second P-type transistor MP2 to prevent the first P-type transistor MP1 and the second P-type transistor MP2 from becoming overcurrent. Then, the output voltage VOUT and the system voltage VCC are at the same voltage level.

On the other hand, please continuously refer to FIG. 6 if it is needed, please refer to the waveform of driving in FIG. 5 to further understand the present embodiment, wherein a waveform of the third control signal CS3 is identical to the waveform of the first control signal CS1, and the waveform of the fourth control signal CS4 is identical to the waveform of the second control signal CS2. In the present embodiment, another end of the inductor L of the output-stage circuit 400 electrically connected to the third reference voltage VREF3 is the ground voltage GND; during a time from t21 to t22, the output voltage VOUT continuously gets smaller towards a voltage level of the ground voltage GND and the output current IOUT also continuously increases; likewise, when the detector 150 detects that the output current IOUT flowing through the inductor L is larger than a current threshold value (which means that the first P-type transistor MP1 and the second P-type transistor MP2 may about to be overcurrent), then there is a detecting result RS transmitted to the controller 160, wherein a designer may further design a current threshold value according to an actual circuit application demand. Afterwards, according to the detecting result RS received, the controller 160 transits the first control signal CS2 and the fourth control signal CS4 of the low voltage level to the high voltage level and transmits the first control signal CS2 and the fourth control signal CS4 to the first N-type transistor MN1 and the second N-type transistor MN2 to open the first N-type transistor MN1 and the second N-type transistor MN2 and to create a second current channel and a fourth current channel, wherein the second current channel and the fourth current channel having a feature of low impedance are respectively a n-channel between a drain and a source of the first N-type transistor MN1 and a n-channel between a drain and a source of the second N-type transistor MN2; meanwhile, the controller 160 also transits the first control signal CS1 and a third control signal CS3 of the low voltage level from the low voltage level to the high voltage level and the first control signal CS1 and the third control signal CS3 are transmitted to the first P-type transistor MP1 and the second P-type transistor MP2 to close the first P-type transistor MP1 and the second P-type transistor MP2 and to further change the current path of the output current IOUT, and accordingly the output current IOUT is brought to the second current channel and the fourth current channel inside the first N-type transistor MN1 and the second N-type transistor MN2 to release the output current IOUT to an end of the ground voltage GND, wherein a current path of the output current IOUT starts to present a sign of decreasing. The current path that the output current IOUT flows through the second current channel and a fourth current channel has a more obvious feature of lower impedance than the current path that the output current IOUT flows through a second body diode D2, a fourth body diode D4 and a second body selector 140; therefore, during the time a transient-state of releasing the output current IOUT, a spiking voltage of an output voltage VOUT will not overly surge low, so that the most surge of the output voltage VOUT is not much more than the ground voltage GND, and further to protect the relevant electronic elements electrically connected to the output voltage VOUT. It is to be noticed that, in the present embodiment, during the transient-state of releasing the output current IOUT, the detector 150 still keeps detecting a value change of the output current IOUT; the detector 150 detects that the current value of the output current IOUT decreases until becoming zero current, and the detector 150 transmits the detecting result RS to the controller 160. Afterwards, according to the detecting result RS, the controller 160 transits the first control signal CS2 and the fourth control signal CS4 of the high voltage level to the low voltage level and transmits the second control signal CS2 and the fourth control signal CS4 to the first N-type transistor MN1 and the second N-type transistor MN2 to close the first N-type transistor MN1 and the second N-type transistor MN2 to prevent the first N-type transistor MN1 and the second N-type transistor MN2 from becoming an overcurrent. Afterwards, the output voltage VOUT and the ground voltage GND will be at the same voltage level.

[An Embodiment of an Over-Current Protection Method of an Output-Stage Circuit]

Figure 7:
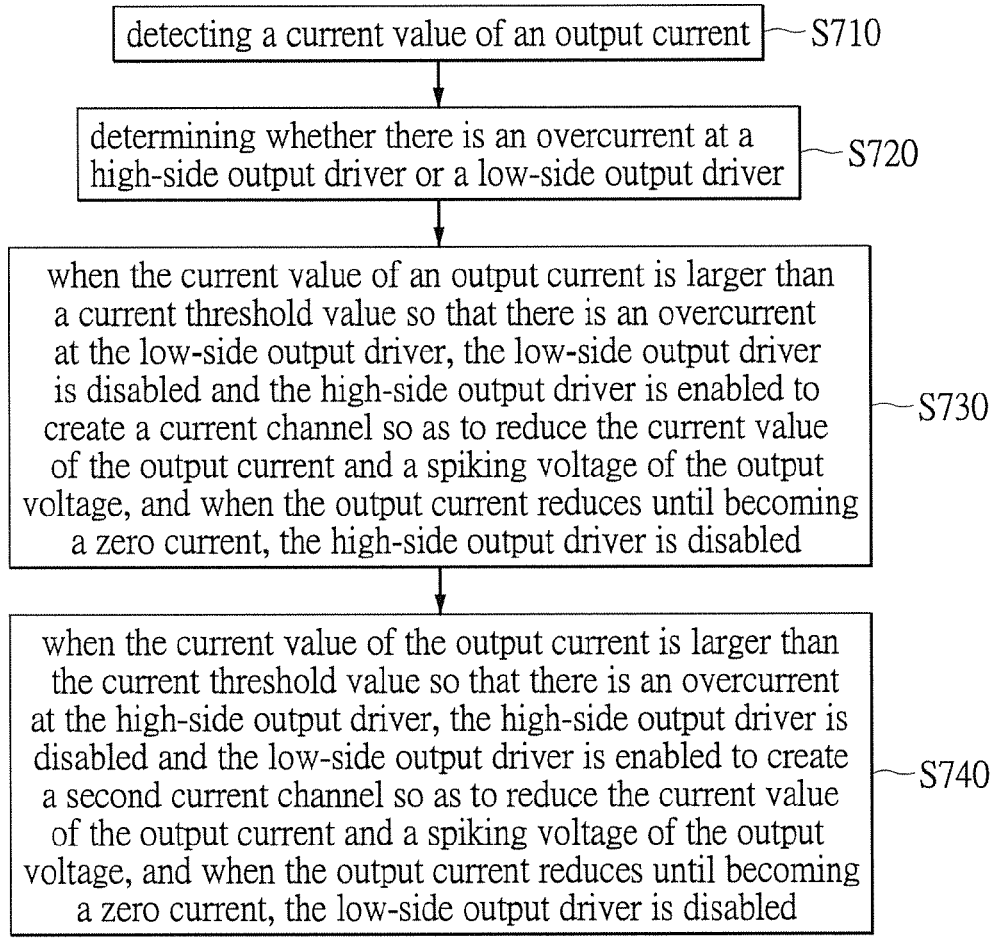
FIG. 7 shows an over-current protection method of an output-stage circuit according to an embodiment of the instant disclosure.

Referring to FIG. 7, FIG. 7 shows an over-current protection method of an output-stage circuit according to an embodiment of the instant disclosure. The method may be executed on every output-stage circuit in FIGS. 1, 2, 4, and 6, and thus please refer to FIGS. 1-3 for a better understanding. In the present embodiment, the output-stage circuit over-current protection method includes steps as follows: detecting a current value of an output current (S710); determining whether is an overcurrent at a high-side output driver or a low-side output driver (S720); when the current value of an output current is larger than a current threshold value so that there is an overcurrent at the low-side output driver, the low-side output driver is disabled and the high-side output driver is enabled to create a current channel so as to reduce the current value of the output current and a spiking voltage of the output voltage, and when the output current reduces until becoming a zero current, the high-side output driver is disabled (S730); when the current value of the output current is larger than the current threshold value so that there is an overcurrent at the high-side output driver, the high-side output driver is disabled and the low-side output driver is enabled to create a second current channel so as to reduce the current value of the output current and a spiking voltage of the output voltage, and when the output current reduces until becoming a zero current, the low-side output driver is disabled (S740). Briefly, any idea which is not irrelevant to "when an output current larger than a current threshold value a current path of an output current is changed to a current channel of a lower impedance to release an output current so as to prevent a spiking voltage of the output voltage from being over and damaging adjacent electronic elements" is identified to be within the scope of the present embodiment of the instant disclosure.

Relevant details of steps of the over-current protection method of the output-stage circuit are described in the embodiments in FIGS. 1-6, and thus it is not repeated thereto. It is to be clarified that a sequence of steps of the embodiment in FIG. 7 is simply for an easy instruction, and the sequence of the steps of the present embodiment is not used as a condition to embody the embodiments of the instant closure.

[An Embodiment of an Audio Amplify System]

Figure 8:
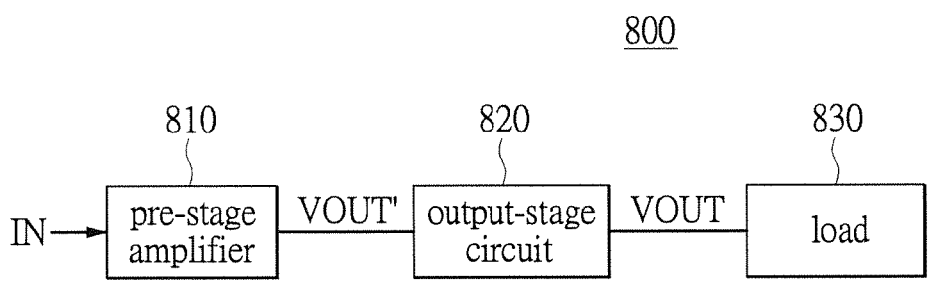
FIG. 8 shows a block circuit diagram according to an audio amplify system according to an embodiment of the instant disclosure.

Referring to FIG. 8, FIG. 8 shows a block circuit diagram according to an audio amplify system according to an embodiment of the instant disclosure. An audio amplify system 800 includes a pre-stage amplifier 810, an output-stage circuit 820 and a load 830. In the present embodiment, the pre-stage amplifier 810 receives and amplifies an input signal IN, and the output-stage circuit 820 is electrically connected to the pre-stage amplifier 820 to receive an output signal VOUT', and to transmit an output voltage VOUT to the load 830. The output-stage circuit 820 may be anyone of output-stage circuits 100, 200, 400, 600 in the embodiments as described above.

To sum up, the instant disclosure provides an output-stage circuit and an over-current protection method and an audio amplify system, which are able to utilize detecting if an output current is larger than a current threshold value to determine whether to change a current path of the output current, which means to bring the output current to a first current channel or a second current channel to reduce a current value of the output current, and further to reduce a spiking voltage of the output voltage to prevent the output voltage from damaging or striking the relevant electronic elements.

The descriptions illustrated supra set forth simply the preferred embodiments of the instant disclosure; however, the characteristics of the instant disclosure are by no means restricted thereto. All changes, alternations, or modifications conveniently considered by those skilled in the art are deemed to be encompassed within the scope of the instant disclosure delineated by the following claims.

What is claimed is:

1. An output-stage circuit, comprising:
a high-side output driver, electrically connected to a system voltage and a first control signal;
a first body selector, electrically connected to the high-side output driver, and the first body selector receiving a first reference voltage and the system voltage;
a low-side output driver, electrically connected to a ground voltage and a second control signal, wherein the high-side output driver is directly connected to the low-side output driver and generating an output voltage;

a second body selector, electrically connected to the low-side output driver, and the second body selector receiving a second reference voltage and the ground voltage; and an inductor, having an end electrically connected to the output voltage, and another end electrically connected to a third reference voltage, and there is an output current flowing through the inductor, wherein, when the output current is larger than a current threshold value so that the low-side output driver generates an overcurrent, the low-side output driver controlled by the second control signal is disabled and the high-side output driver controlled by the first control signal is enabled so as to create a first current channel of low impedance, and then changes current of the output current and accordingly to reduce the spiking voltage of the output voltage after an overcurrent prevention started by the low-side output driver, when the output current is larger than the current threshold value so that the high-side output driver generates an overcurrent, the high-side output driver controlled by the first control signal is disabled, and the low-side output driver controlled by the second control signal is enabled so as to create a second current channel, and then changes current of the output current and a current path and accordingly to reduce the output current and a voltage spiking of the output voltage after an overcurrent prevention started by the high-side output driver.

2. The output-stage circuit according to claim 1, wherein when the output current reduces until becoming a zero current, and the high-side output driver controlled by the first control signal is disabled to close the first current channel, wherein the first current channel has a better feature of low impedance in comparison to the first body selector.

3. The output-stage circuit according to claim 1, wherein when the output current reduces until becoming a zero current, and the low-side output driver controlled by the second control signal is disabled to close the second current channel, wherein the second current channel has a better feature of low impedance in comparison to the second body selector.

4. The output-stage circuit according to claim 1, further comprising:

a detector, detecting if an output current is larger than the current threshold value or the zero current, and accordingly transmitting a detecting result; and a controller, electrically connected to the detector, and according to the detecting result received to respectively transmitting the first control signal and the second control signal to the high-side output driver and the low-side output driver corresponded so as to control a state of being disabled or being enabled.

5. The output-stage circuit according to claim 1, wherein the third reference voltage is the system voltage or the ground voltage.

6. The output-stage circuit according to claim 1, wherein the high-side output driver comprises a first P-type transistor, and the low-side output driver comprises a first N-type transistor, wherein the first P-type transistor has a gate receiving the first control signal and accordingly determining to be open or closed, a source connected to the system voltage, a drain connected to output node, a body connected to the first body selector, and a embedded drain(P+) to body(N-Well) diode called as first body diode, wherein the first N-type transistor has a second body diode having a gate receiving the second control signal and accordingly to determine whether to be open or closed, a source connected to the ground voltage, a drain connected to the same output node of the first P-type transistor, a body connected to the second body selector, and a embedded body(P-sub or P-well) to drain(N+) diode called as second body diode, wherein when a current value of the output current is larger than the current threshold value so that there is an overcurrent at the first N-type transistor, and the first N-type transistor controlled by the second control signal is disabled, and the first P-type transistor controlled by the first control signal is enabled so as to create the first current channel so as to reduce the current value of the output current and the spiking voltage of the output voltage, wherein the first current channel is the channel between a drain and a source of the first P-type transistor.

7. The output-stage circuit according to claim 6, wherein when the current value of the output current is larger than the current threshold value so that there is the overcurrent at the first P-type transistor, a first P-type transistor controlled by the first control signal is disabled, and the first N-type transistor controlled by the second control signal is enabled to create the second current channel so as to reduce the current value of the output current and the spiking voltage of the output voltage, wherein the second current channel is the channel between a drain and a source of the first N-type transistor.

8. The output-stage circuit according to claim 6, wherein the high-side output driver further comprises a second P-type transistor, and the low-side output driver further comprises a second N-type transistor, wherein the second P-type transistor has a third body diode having a source connected to a drain of the first P-type transistor, and having a gate receiving a third control signal so as to determine to be open or closed, and the second N-type transistor has a fourth body diode having a drain connected to a drain of the second P-type transistor and outputs an output voltage, and having a gate receiving a fourth control signal so as to determine to be open or closed, and having a source connected to a drain of the first N-type transistor.

9. An over-current protection method of an output-stage circuit, and the output-stage circuit comprising a high-side output driver, a first body selector, a low-side output driver, a second body selector, and an inductor, wherein the high-side output driver is electrically connected to a system voltage and a first control signal, and the first body selector is electrically connected to a high-side output driver, and receiving a first reference voltage and a system voltage, the low-side output driver is electrically connected to a ground voltage and a second control signal, and a high-side output driver is directly connected to the low-side output driver to generate an output voltage, and the second body selector is electrically connected to the low-side output driver and receives a second reference voltage and a ground voltage; an end of an inductor is electrically connected to the output voltage, and another end is electrically connected to a third reference voltage, and there is an output current flowing through the inductor, and the over-current protection method comprising steps as follows:

detecting a current value of an output current;

determining whether there is an overcurrent at the high-side output driver or the low-side output driver;

when the current value of the output current is larger than a current threshold value so that there is an overcurrent at the low-side output driver, the low-side output driver is disabled and the high-side output driver is enabled to create a first current channel so as to reduce the current value of the output current and a spiking voltage of the output voltage, and when the current value of the output current is larger than the current threshold value so that there is an overcurrent at the high-side output driver, the high-side output driver is disabled and the low-side output driver is enabled to create a second current channel so as to reduce the current value of the output current and a spiking voltage of the output voltage.

10. The over-current protection method according to claim 9, further comprising:

when an output current reduces until becoming a zero current, the high-side output driver controlled by the first control signal is disabled to close the first current channel, wherein the first current channel has a better feature of low impedance in comparison to the first body selector.

11. The over-current protection method according to claim 9, further comprising:

when an output current reduces until becoming a zero current, the low-side output driver controlled by the second control signal is disabled to close the second current channel, wherein the second current channel has a better feature of low impedance in comparison to the second body selector.

12. The output-stage circuit according to claim 9, wherein the output-stage circuit further comprising:

a detector, detecting if the output current is larger than the current threshold value or the zero current, and accordingly transmitting a detecting result; and a controller, electrically connected to the detector, and according to the detecting result received to respectively transmitting the first control signal and the second control signal to the high-side output driver and the low-side output driver corresponded so as to control a state of being disabled or being enabled.

13. An audio amplify system, comprising:

a pre-stage amplifier, receiving and amplifying an input signal;

an output-stage circuit according to claim 1, electrically connected to the pre-stage amplifier; and a load, electrically connected to the output-stage circuit.

* * * * *